(12) United States Patent
Ra et al.

(10) Patent No.: US 11,508,805 B2
(45) Date of Patent: Nov. 22, 2022

(54) DISPLAY PANEL AND DISPLAY DEVICE INCLUDING THE SAME

(71) Applicant: Samsung Display Co., Ltd., Yongin-si (KR)

(72) Inventors: Yoomi Ra, Ansan-si (KR); Kyung-Ho Park, Hwaseong-si (KR); Sungjae Moon, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 72 days.

(21) Appl. No.: 17/198,527

(22) Filed: Mar. 11, 2021

(65) Prior Publication Data

US 2021/0376050 A1 Dec. 2, 2021

(30) Foreign Application Priority Data

Jun. 1, 2020 (KR) ........................ 10-2020-0065982

(51) Int. Cl.
*G09G 3/32* (2016.01)
*H01L 27/32* (2006.01)

(52) U.S. Cl.
CPC ...... *H01L 27/3279* (2013.01); *H01L 27/3211* (2013.01)

(58) Field of Classification Search
CPC .................. G09G 3/20; G09G 3/2074; G09G 2300/0443; G09G 2320/0673; G09G 2320/0686; G09G 2360/16; G09G 3/34; G09G 3/30; G09G 3/32; G06T 7/13; G06T 5/005; G06T 5/20; G06T 2207/20028; G06T 2207/20032; G06V 10/751

See application file for complete search history.

(56) References Cited

U.S. PATENT DOCUMENTS

| 2007/0035485 | A1 | 2/2007 | Yoon | |
|---|---|---|---|---|
| 2013/0181605 | A1 | 7/2013 | Chang et al. | |
| 2014/0036191 | A1 | 2/2014 | Zhao et al. | |
| 2014/0043306 | A1* | 2/2014 | Min | G09G 3/3677 345/204 |
| 2018/0122329 | A1* | 5/2018 | Chen | G09G 5/003 |
| 2019/0004383 | A1* | 1/2019 | Gao | H01L 27/124 |
| 2020/0152132 | A1* | 5/2020 | Kim | G09G 3/3266 |

FOREIGN PATENT DOCUMENTS

| KR | 10-0560780 B1 | 3/2006 |
|---|---|---|
| KR | 10-2004710 B1 | 7/2019 |
| KR | 10-2034112 B1 | 10/2019 |

* cited by examiner

*Primary Examiner* — Pegeman Karimi
(74) *Attorney, Agent, or Firm* — Lewis Roca Rothgerber Christie LLP

(57) ABSTRACT

A display panel includes: a plurality of divided driving parts, wherein at least a divided driving part of the divided driving parts includes: a first connection line extending in a first direction; a second connecting line extending in the first direction and spaced apart from the first connection line in a second direction crossing the first direction; a first gate line extending in the second direction and electrically connected to the first connection line; a second gate line extending in the second direction, being spaced apart from the first gate line, and being electrically connected to the second connection line; a first pixel in a first pixel column and a first pixel row and electrically connected to the first gate line; and a second pixel in the first pixel column and a second pixel row and electrically connected to the second gate line.

31 Claims, 9 Drawing Sheets

DISPLAY PANEL AND DISPLAY DEVICE INCLUDING THE SAME

CROSS-REFERENCE TO RELATED APPLICATION

The present application claims priority to and the benefit of Korean Patent Application No. 10-2020-0065982, filed on Jun. 1, 2020, the entirety of which is incorporated herein by reference.

BACKGROUND

Field

Aspects of some example embodiments of the invention relate generally to a display panel and a display device including the same.

Discussion of the Background

A display device generally includes a display panel and a driver located adjacent to one side (e.g., a left side) of the display panel. The display panel includes pixels and driving lines for transmitting a driving signal generated from the driver. Recently, as the display device gradually increases in size, a transmission time of the driving signal transmitted to a pixel far from the driver may be relatively delayed. In order to solve this problem, a structure has been developed in which an additional driver is additionally located on the other side (e.g., a right side) opposite to the one side of the display panel, but the structure increases the bezel of the display device.

The above information disclosed in this Background section is only for enhancement of understanding of the background and therefore the information discussed in this Background section does not necessarily constitute prior art.

SUMMARY

Aspects of some example embodiments of the invention relate generally to a display panel and a display device including the same. For example, aspects of some example implementations of the invention relate to the display panel including connecting lines.

Aspects of some example embodiments include a gate test part with reduced transmission time and reduced bezel.

Aspects of some example embodiments include a display device including the display panel.

A display panel according to some example embodiments may include a plurality of divided driving parts. At least a divided driving part of the divided driving parts may include a first connection line extending in a first direction, a second connecting line extending in the first direction and being spaced apart from the first connection line in a second direction crossing the first direction, a first gate line extending in the second direction and being electrically connected to the first connection line, a second gate line extending in the second direction, being spaced apart from the first gate line, and being electrically connected to the second connection line, a first pixel in a first pixel column and a first pixel row and being electrically connected to the first gate line, and a second pixel in the first pixel column and a second pixel row and being electrically connected to the second gate line, wherein the second pixel row is spaced apart from the first pixel row in the first direction. The first connection line and the second connection line may be arranged to correspond to the first pixel column.

According to some example embodiments, the divided driving part may further include a high power voltage line extending in the first direction, and the high power voltage line may be arranged to correspond to the first pixel column.

According to some example embodiments, the divided driving part may further include at least one data line extending in the first direction. The data line may be arranged to correspond to the first pixel column and may be electrically connected to the first pixel and the second pixel.

According to some example embodiments, the second connection line may be between the first connection line and the first pixel, on a plane.

According to some example embodiments, the first pixel may be between the second connection line and the data line, on a plane.

According to some example embodiments, the divided driving part may further include a low power voltage line extending in the first direction and may be spaced apart from the high power voltage line in the second direction. The first connection line and the second connection line may be between the high power voltage line and the low power voltage line, on a plane.

According to some example embodiments, the high power voltage line may be between the second connection line and the first pixel, on a plane.

According to some example embodiments, the first pixel may include a first sub-pixel, a second sub-pixel, and a third sub-pixel, and the data line may include first to third data lines spaced apart from each other in the second direction and may be electrically connected to the first to third sub-pixels, respectively.

According to some example embodiments, the first sub-pixel may include a substrate, an active pattern on the substrate, a gate electrode on the active pattern, and a connection electrode on the gate electrode. The first gate line may be in a same layer as the connection electrode, and the first gate line may contact the first connection line through a first contact hole exposing the first connection line overlapping the first gate line.

According to some example embodiments, the first connection line may include a first metal pattern, and the first metal pattern may be between the substrate and the active pattern and may extend in the first direction.

According to some example embodiments, the first connection line may further include a second metal pattern, and the second metal pattern may be on the first metal pattern, may overlap the first metal pattern, and may be electrically connected to the first metal pattern.

According to some example embodiments, the first connection line may further include a third metal pattern, and the third metal pattern may be on the second metal pattern, may overlap the second metal pattern, and may be electrically connected to the second metal pattern.

According to some example embodiments, the second metal pattern may be in a same layer as the gate electrode, and the third metal pattern may be in a same layer as the connection electrode.

According to some example embodiments, the first sub-pixel further may include a first electrode on the connection electrode, an emission layer on the first electrode, and a second electrode on the emission layer.

According to some example embodiments, the second gate line may be in a same layer as the connection electrode, and the second gate line may contact the second connection line through a second contact hole exposing the second connection line overlapping the second gate line.

According to some example embodiments, the first contact hole and the second contact hole may be spaced apart from each other.

According to some example embodiments, the first connection line may be between the second connection line and the first pixel, on a plane.

According to some example embodiments, the first pixel may be between the first connection line and the data line, on a plane.

According to some example embodiments, the divided driving part may further include a low power voltage line spaced apart from the high power voltage line in the second direction, and the first connection line and the second connection line may be between the high power voltage line and the low power voltage line, on a plane.

According to some example embodiments, the high power voltage line may be between the first connection line and the first pixel, on a plane.

According to some example embodiments, the data line may be between the first pixel and the first connection line, on a plane.

According to some example embodiments, the first connection line may be between the data line and the second connection line, on a plane.

According to some example embodiments, the first connection line and the second connection line may be between the first pixel and the data line, on a plane.

According to some example embodiments, the divided driving part may further include a dummy line extending in the first direction and may be in a same layer as the first and second connection lines, a gate signal may be provided to each of the first and second connection lines, and a constant voltage may be provided to the dummy line.

According to some example embodiments, the divided driving parts may be arranged along the second direction.

According to some example embodiments, the first connection line may be not electrically connected to the second gate line.

According to some example embodiments, a contact hole may not be formed in a region where the first connection line and the second gate line overlap.

According to some example embodiments, the second connection line may not be electrically connected to the first gate line.

According to some example embodiments, a contact hole may not be formed in a region where the second connection line and the first gate line overlap.

A display device according to some example embodiments may include a display panel comprising a plurality of divided driving parts and being in a display area, a gate driver in a non-display area adjacent to the display area, a data driver in the non-display area, and a timing controller in the non-display area and controlling the gate driver and the data driver. At least a divided driving part of the divided driving parts may include a first connection line extending in a first direction, a second connecting line extending in the first direction and being spaced apart from the first connection line in a second direction crossing the first direction, a first gate line extending in the second direction and being electrically connected to the first connection line, a second gate line extending in the second direction, being spaced apart from the first gate line, and being electrically connected to the second connection line, a first pixel in a first pixel column and a first pixel row and being electrically connected to the first gate line, and a second pixel in the first pixel column and a second pixel row and being electrically connected to the second gate line, wherein the second pixel row is spaced apart from the first pixel row in the first direction. The first connection line and the second connection line may be arranged to correspond to the first pixel column.

According to some example embodiments, the gate driver and the data driver may be in the non-display area adjacent to one side of the display panel.

Therefore, the display panel according to some example embodiments may include a plurality of divided driving parts, and each of the divided driving parts may include a plurality of connection lines. As the connection lines respectively transmit gate signals to pixels included in the divided driving parts, transmission times of the gate signals may be shortened. In addition, a display device including the display panel may include a gate driver on one side (e.g., a lower side) of the display panel and a data driver on the one side (e.g., the lower side). Accordingly, bezel of the other side (e.g., left or right side) of the display device may be reduced.

It is to be understood that both the foregoing general description and the following detailed description are merely examples and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate aspects of some example embodiments of the invention, and together with the description serve to explain the inventive concepts.

DETAILED DESCRIPTION

Illustrative, non-limiting example embodiments will be more clearly understood from the following detailed description in conjunction with the accompanying drawings.

Figure 1:
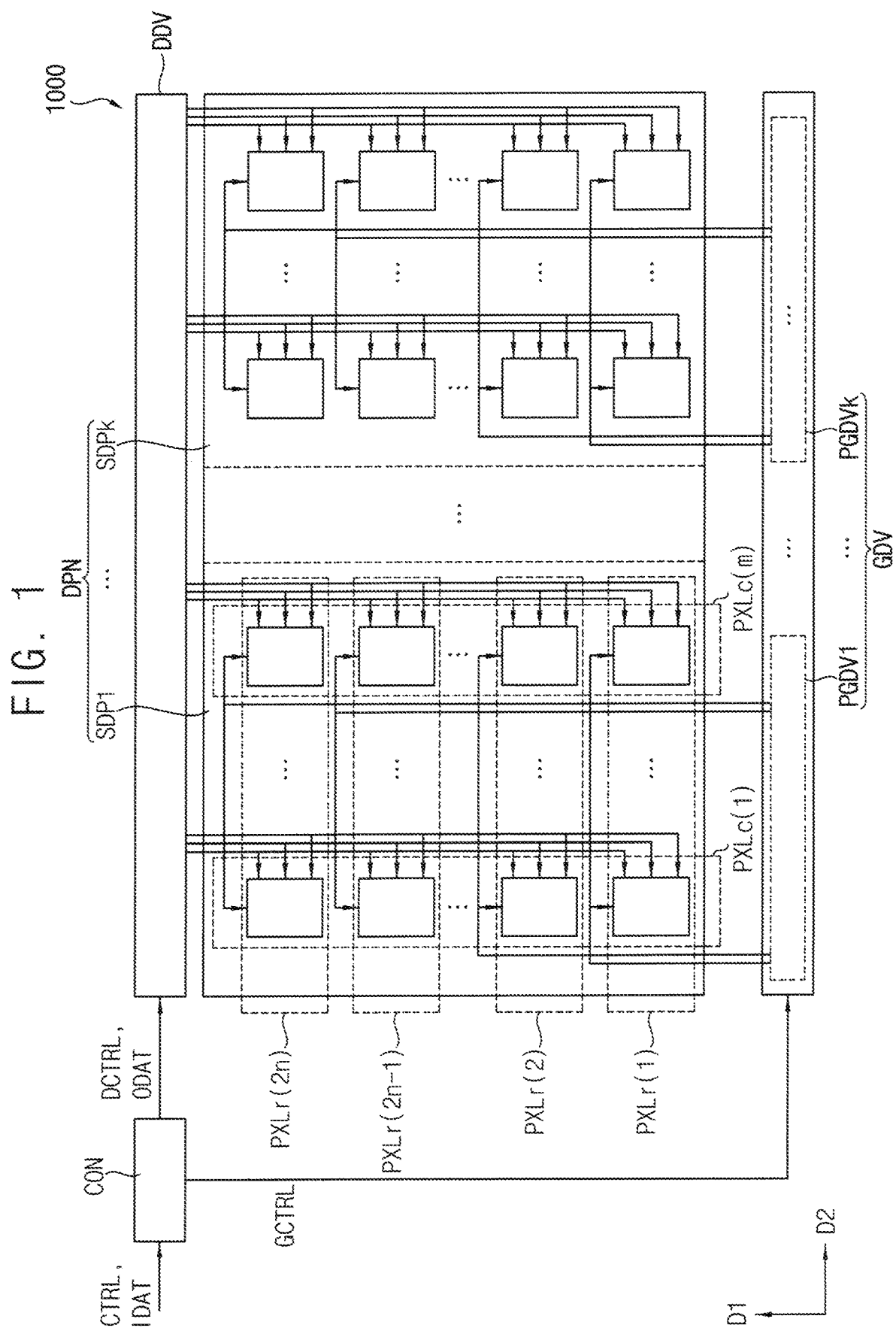
FIG. 1 is a block diagram illustrating a display device according to some example embodiments.

FIG. 1 is a block diagram illustrating a display device according to some example embodiments.

Referring to FIG. 1, a display device 1000 according to some example embodiments may include a display panel DPN, a gate driver GDV, a data driver DDV, and a timing controller CON.

A plurality of pixels and a plurality of lines may be located in the display panel DPN. The pixels may emit light by receiving signals and/or voltages from the lines.

According to some example embodiments, the display panel DPN may include a plurality of divided driving parts. For example, the display panel DPN may include a first divided driving part SDP1 to a (k)-th (where k is an integer of 2 or more) divided driving parts SDPk. According to some example embodiments, each of the divided driving parts may be formed the substantially same. For example, (2n×m) pixels may be located in the first divided driving part SDP1, and (2n×m) pixels may be located in the (k)-th divided driving part SDPk. Alternatively, according to some example embodiments, each of the divided driving parts may be formed differently from each other.

The timing controller CON may generate a gate control signal GCTRL, a data control signal DCTRL, and output image data ODAT based on a control signal CTRL and input image data IDAT provided from an external device. The timing controller CON may be formed on a printed circuit board PCB. For example, the control signal CTRL may include a vertical synchronization signal, a horizontal synchronization signal, an input data enable signal, a master clock signal, and the like, and the input image data IDAT may be RGB data including red image data, green image data, and blue image data.

The gate driver GDV may generate gate signals based on the gate control signal GCTRL provided from the timing controller CON. For example, the gate control signal GCTRL may include a vertical start signal and a clock signal.

The gate driver GDV may be electrically connected to the display panel DPN, and may sequentially output the gate signals. Each of the pixels may receive a data voltage in response to each of the gate signals.

According to some example embodiments, the gate driver GDV may include partial gate drivers corresponding to the divided driving parts. For example, the gate driver GDV may include a first partial gate driver PGDV1 to a (k)-th partial gate driver PGDVk. The first partial gate driver PGDV1 may sequentially output the gate signals to the first divided driving part SDP1, and the (k)-th partial gate driver PGDVk may sequentially output the gate signals to the (k)-th divided driving part SDPk.

The data driver DDV may generate the data voltage based on the data control signal DCTRL and the output image data ODAT provided from the timing controller CON. For example, the data control signal DCTRL may include an output data enable signal, a horizontal start signal, and a load signal.

The data driver DDV may be electrically connected to the display panel DPN and may generate the data voltages. Each of the pixels may emit light having a luminance corresponding to each of the data voltages. According to some example embodiments, the data driver DDV may include a plurality of data driving circuits.

According to some example embodiments, the pixels may be arranged in a matrix arrangement. Each of the first to (k)-th divided driving parts SDP1 to SDPk may be divided into a plurality of rows and a plurality of columns. For example, the rows may include first pixel row PXLr(1) to (2n)-th pixel row PXLr(2n) which are arranged along a first direction D1, and the columns may include first pixel column PXLc(1) to (m)-th pixel column PXLc(m) which are arranged along a second direction D2 crossing the first direction D1. Accordingly, a pixel among the pixels may be arranged in a pixel row among the pixel rows and a pixel column among the pixel columns.

According to some example embodiments, the first partial gate driver PGDV1 may output gate signals to the pixels located in the first divided driving part SDP1. For example, the first partial gate driver PGDV1 may sequentially output a first gate signal to a (2n)-th gate signal. The first gate signal may be provided to the pixels located in the first pixel row PXLr(1), and the (2n)-th gate signal may be provided to the pixels located in the (2n)-th pixel row PXLr(2n).

According to some example embodiments, the (k)-th partial gate driver PGDVk may output gate signals to the pixels located in the (k)-th divided driving part SDPk. For example, the (k)-th partial gate driver PGDVk may sequentially output a first gate signal to a (2n)-th gate signal. The first gate signal to the (2n)-th gate signal may be the substantially same as the first to the (2n)-th gate signal output from the first partial gate driver PGDV1.

Figure 2:
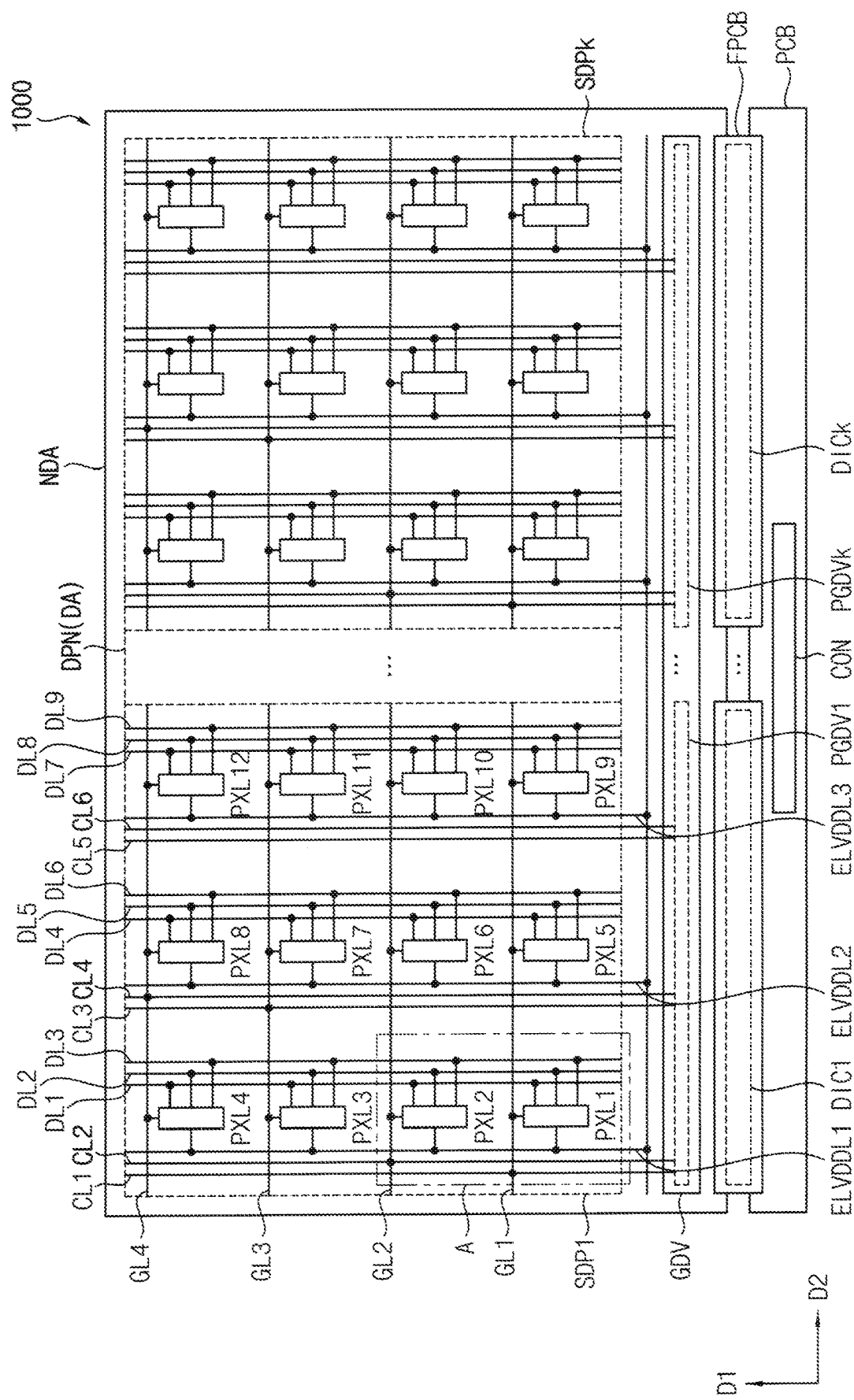
FIG. 2 is a plan view illustrating the display device of FIG. 1.

FIG. 2 is a plan view illustrating the display device of FIG. 1.

Referring to FIGS. 1 and 2, the display device 1000 may be divided into a display area DA in which the display panel DPN is located, and a non-display area NDA in which the display panel DPN is not located.

The display panel DPN may include the first divided driving part SDP1 to the (k)-th divided driving part SDPk. For example, 12 pixels may be located in each of the first divided driving part SDP1 to the (k)-th divided driving part SDPk.

According to some example embodiments, the first to twelfth pixels PXL1, PXL2, PXL3, PXL4, PXL5, PXL6, PXL7, PXL8, PXL9, PXL10, PXL11, and PXL12 may be located in the first divided driving part SDP1. For example, the first to fourth pixels PXL1, PXL2, PXL3, and PXL4 may be located in the first pixel column PXLc(1), the fifth to eighth pixels PXL5, PXL6, PXL7 and PXL8 may be located in the second pixel column PXLc(2), and the ninth to twelfth pixels PXL9, PXL10, PXL11, and PXL12 may be located in the third pixel column PXLc(3). In addition, the first, fifth, and ninth pixels PXL1, PXL5, and PXL9 may be located in the first pixel row PXLr(1), the second, sixth, and tenth pixels PXL2, PXL6, and PXL10 may be located in the second pixel row PXLr(2), the third, seventh, and eleventh pixels PXL3, PXL7, and PXL11 may be located in the third pixel row PXLr(3), and the fourth, eighth, and twelfth pixels PXL4, PXL8, and PXL12 may be located in the fourth pixel row PXLr(4).

According to some example embodiments, 6 connection lines, 4 gate lines, and 9 data lines may be located in each of the first divided driving part SDP1 to the (k)-th divided driving part SDPk. For example, first to sixth connection lines CL1, CL2, CL3, CL4, CL5, and CL6, first to fourth gate lines GL1, GL2, GL3, GL4, and first to ninth data lines DL1, DL2, DL3, DL4, DL5, DL6, DL7, DL8, and DL9 may be located in the first divided driving part SDP1.

According to some example embodiments, each of the connection lines may extend in the first direction D1 and may be spaced apart from each other in the second direction D2. For example, the first and second connection lines CL1 and CL2 may be arranged to correspond to the first pixel column PXLc(1), the third and fourth connection lines CL3 and CL4 may be arranged to correspond to the second pixel column PXLc(2), and the fifth and sixth connection lines CL5 and CL6 may be arranged to correspond to the third pixel column PXLc(3). In other words, two connection lines may be arranged to correspond to a pixel column among the pixel columns. However, the number of the connection lines arranged to correspond to a pixel column is not limited thereto. For example, according to some example embodiments, there may be additional or fewer connection lines without departing from the spirit and scope of embodiments according to the present disclosure.

Each of the connection lines may electrically connect a gate line among the gate lines and the gate driver GDV. For example, the first connection line CL1 may electrically connect the first gate line GL1 and the first partial gate driver PGDV1, the second connection line CL2 may electrically connect the second gate line GL2 and the first partial gate driver PGDV1, the third connection line CL3 may electrically connect the third gate line GL3 and the first partial gate driver PGDV1, and the fourth connection line CL4 may electrically connect the fourth gate line GL4 and the first partial gate driver PGDV1.

According to some example embodiments, each of the gate lines may extend in the second direction D2 and may be spaced apart from each other in the first direction D1. For example, the first gate line GL1 may be arranged to correspond to the first pixel row PXLr(1), the second gate line GL2 may be arranged to correspond to the second pixel row PXLr(2), the third gate line GL3 may be arranged to correspond to the third pixel row PXLr(3), and the fourth gate line GL4 may be arranged to correspond to the fourth pixel row PXLr(4).

Each of the gate lines may electrically connect the pixels located in a pixel row among the pixel rows and the connection line. For example, the first gate line GL1 may electrically connect the first, fifth, and ninth pixels PXL1, PXL5, and PXL9 located in the first pixel row PXLr(1) and the first connection line CL1, the second gate line GL2 may electrically connect the second, sixth, and tenth pixels PXL2, PXL6, and PXL10 located in the second pixel row PXLr(2) and the second connection line CL2, the third gate line GL3 may electrically connect the third, seventh, and eleventh pixels PXL3, PXL7, and PXL11 located in the third pixel row PXLr(3) and the third connection line CL3, the fourth gate line GL4 may electrically connect the fourth, eighth, and twelfth pixels PXL4, PXL8, and PXL12 located in the fourth pixel row PXLr(4) and the fourth connection line CL4.

According to some example embodiments, each of the data lines may extend in the first direction D1 and may be spaced apart from each other in the second direction D2. For example, the first to third data lines DL1, DL2, and DL3 may be arranged to correspond to the first pixel column PXLc(1), the fourth to sixth data lines DL4, DL5 and DL6 may be arranged to correspond to the second pixel column PXLc(2), and the seventh to ninth data lines DL7, DL8, and DL9 may be arranged to correspond to the third pixel column PXLc(3). In other words, three data lines may be arranged to correspond to a pixel column among the pixel columns. However, the number of data lines arranged corresponding to a pixel column is not limited thereto. For example, according to some example embodiments, there may be additional or fewer data lines without departing from the spirit and scope of embodiments according to the present disclosure.

Each of the data lines may electrically connect the pixels arranged in a pixel column among the pixel columns and the data driver DDV. For example, the first data line DL1 may electrically connect the first to fourth pixels PXL1, PXL2, PXL3, and PXL4 arranged in the first pixel column PXLc(1) and the data driver DDV.

The gate driver GDV may be arranged in the non-display area NDA adjacent to a lower side of the display panel DPN.

According to some example embodiments, the gate driver GDV may be mounted in the non-display area NDA. The gate driver GDV may include the first partial gate driver PGDV1 to the (k)-th partial gate driver PGDVk. The first partial gate driver PGDV1 to the (k)-th partial gate driver PGDVk may output the gate signals to the pixels arranged in the first divided driving part SDP1 to the (k)-th divided driving part SDPk, respectively.

The data driver DDV may be located in the non-display area NDA adjacent to the lower side of the display panel DPN. According to some example embodiments, the data driver DDV may be implemented with a first data driving circuit DIC1 to a (k)-th data driving circuit DICk. In this case, a flexible printed circuit board FPCB may be located in the non-display area NDA, and each of the data driving circuits may be integrated on the flexible printed circuit board FPCB. The first data driving circuit DIC1 to the (k)-th data driving circuit DICk may output the data voltages to the pixels located in the first divided driving part SDP1 to the (k)-th divided driving part SDPk, respectively.

The gate driver GDV and the data driver DDV included in the display device 1000 according to some example embodiments may be located in the non-display area NDA adjacent to the lower side of the display panel DPN. In other words, the gate driver GDV may not be located in the non-display area NDA adjacent to a left or right side of the display panel DPN. Accordingly, a bezel on the left or right side of the display device 1000 may be reduced.

Meanwhile, the divided driving part, the gate driver, and the data driver included in the display device 1000 are not limited to the above. For example, the number of pixels, the connection lines, the gate lines, or the data lines may be set as necessary. In addition, the gate driver may be implemented with a plurality of gate driving circuits, and each of the gate driving circuits may be integrated on the flexible printed circuit board FPCB.

According to some example embodiments, a plurality of high power voltage lines may be located in the first divided driving part SDP1. For example, first to third high power voltage lines ELVDDL1, ELVDDL2, and ELVDDL3 may be located in the first divided driving part SDP1.

According to some example embodiments, each of the high power voltage lines may extend in the first direction D1 and may be spaced apart from each other in the second direction D2. For example, the first high power voltage line ELVDDL1 may be arranged to correspond to the first pixel column PXLc(1), the second high power voltage line ELVDDL2 may be arranged to correspond to the second pixel column PXLc(2), and the third high power voltage line ELVDDL3 may be arranged to correspond to the third pixel column PXLc(3). In other words, a high power voltage line may be arranged to correspond to a pixel column among the pixel columns. However, the number of high power voltage lines arranged to correspond to a pixel column is not limited thereto.

Each of the high power voltage lines may transmit a high power voltage to the pixels located in a pixel column among the pixel columns. For example, the first high power voltage line ELVDDL1 may transmit the high power voltage to the first to fourth pixels PXL1, PXL2, PXL3, and PXL4 located in the first pixel column PXLc(1), the second high power voltage line ELVDDL2 may transmit the high power voltage to the fifth to eighth pixels PXL5, PXL6, PXL7, and PXL8 located in the second pixel column PXLc(2), the third high power voltage line ELVDDL3 may transmit the high power voltage to the ninth to twelfth pixels PXL9, PXL10, PXL11, and PXL12 located in the first pixel column PXLc(3).

According to some example embodiments, the fifth and sixth connection lines CL5 and CL6 may not be connected to the gate lines. For example, the fifth and sixth connection lines CL5 and CL6 may be dummy lines. Accordingly, a constant voltage may be provided to the fifth and sixth connection lines CL5 and CL6. Alternatively, the fifth and sixth connection lines CL5 and CL6 may be electrically floating.

Figure 3:
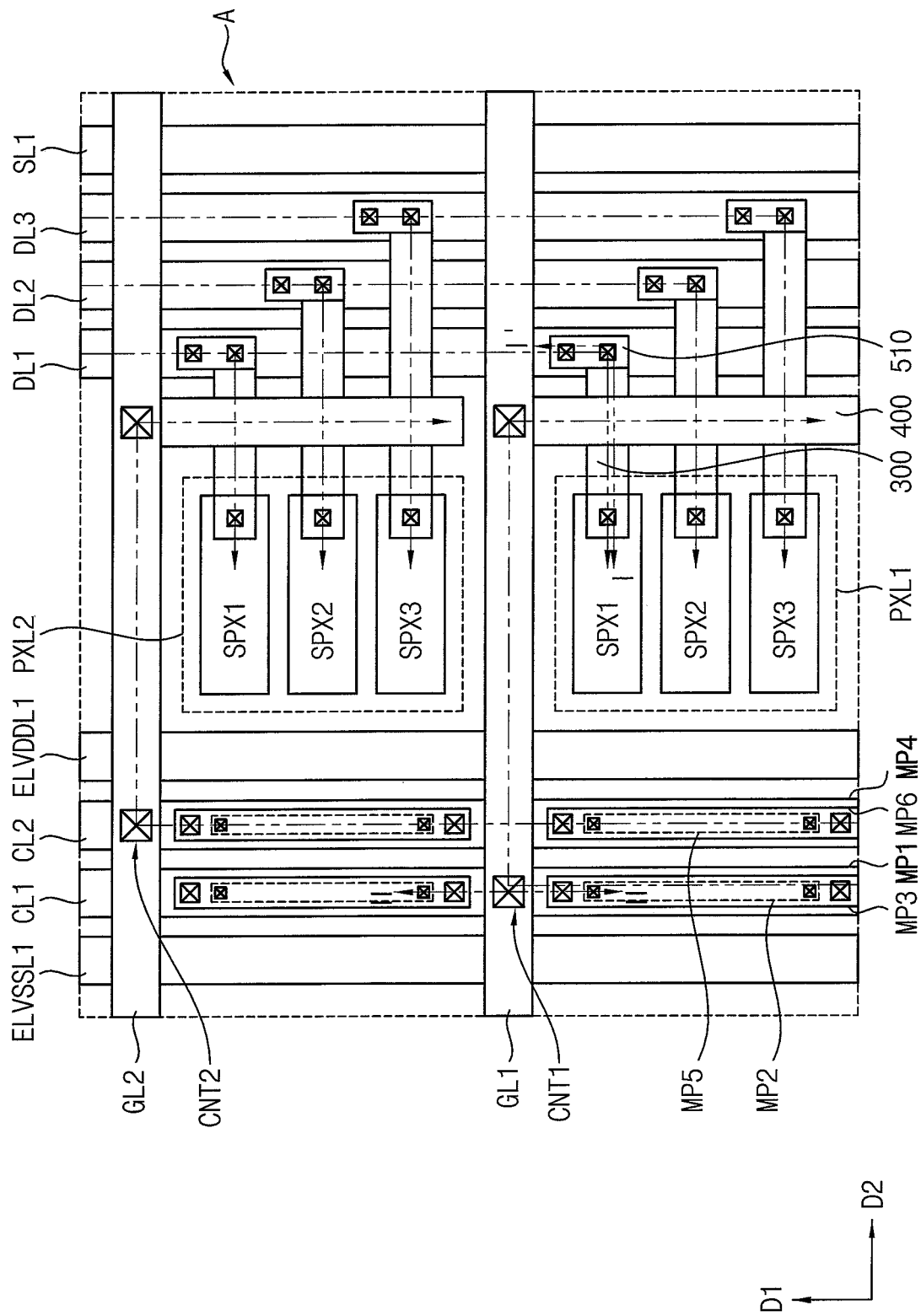
FIG. 3 is an enlarged view of the display device of FIG. 2.
Figure 4:
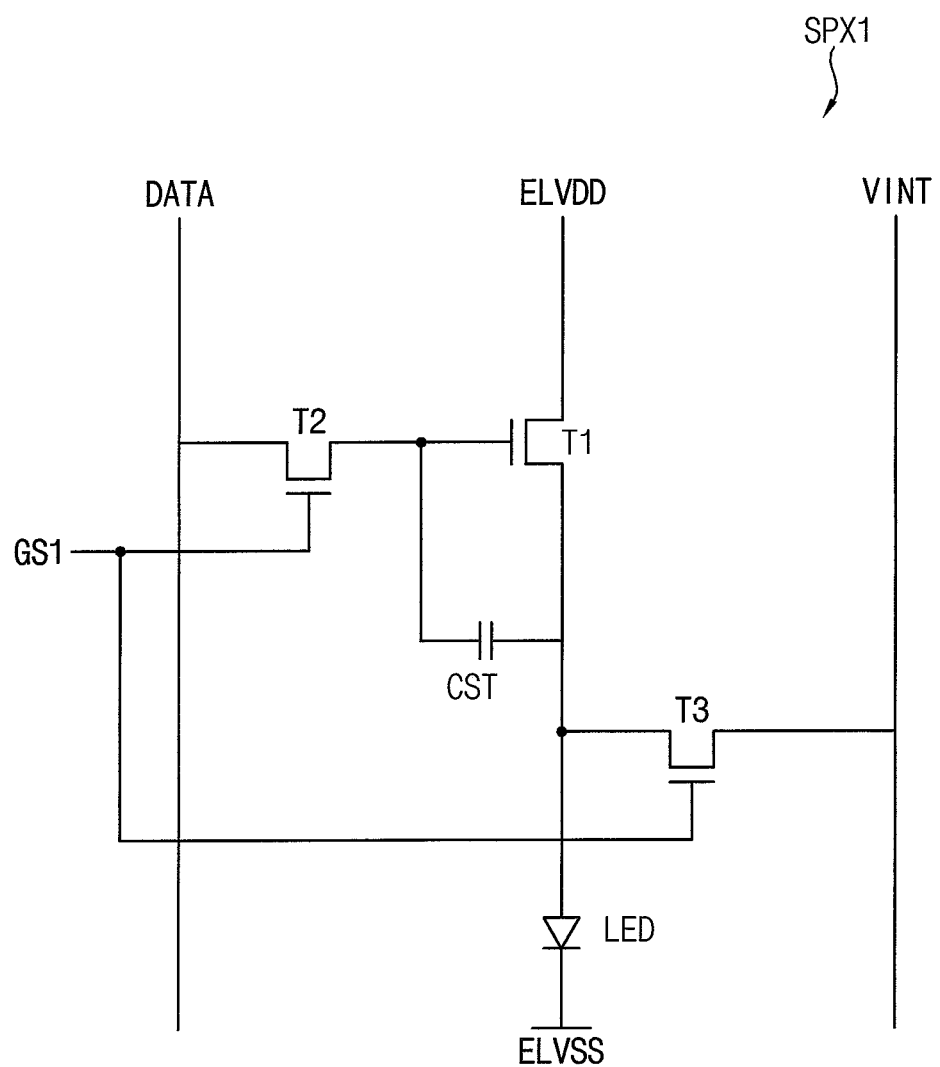
FIG. 4 is a circuit diagram illustrating a sub-pixel included in the display device of FIG. 3.
Figure 5:
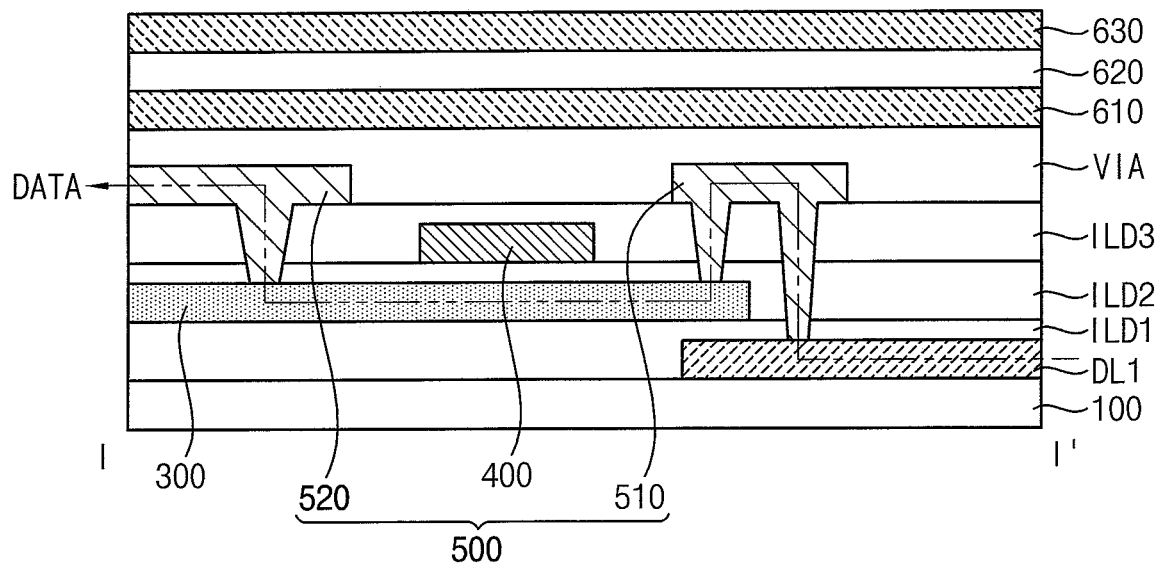
FIG. 5 is a cross-sectional view taken along the line I-I' of FIG. 3.
Figure 6:
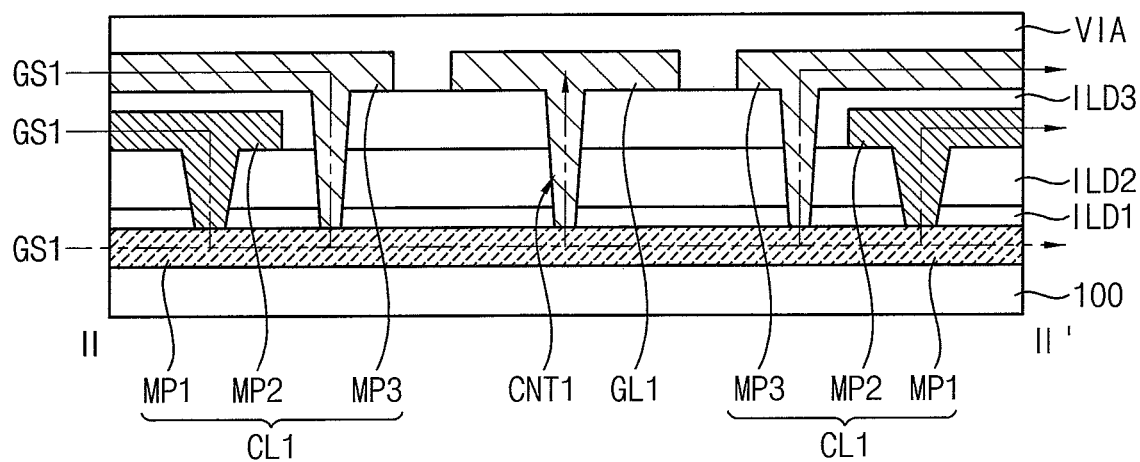
FIG. 6 is a cross-sectional view taken along the line II-II' of FIG. 3.
Figure 7:
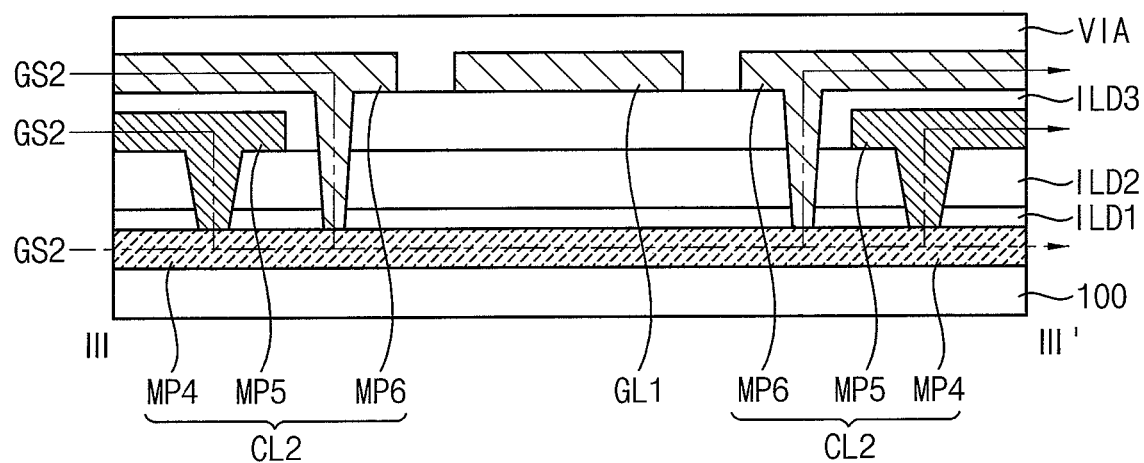
FIG. 7 is a cross-sectional view taken along the line III-III' of FIG. 3.

FIG. 3 is an enlarged view illustrating further details of the display device of FIG. 2. FIG. 4 is a circuit diagram illustrating a sub-pixel included in the display device of FIG. 3. FIG. 5 is a cross-sectional view taken along the line I-I' of FIG. 3. FIG. 6 is a cross-sectional view taken along the line II-II' of FIG. 3. FIG. 7 is a cross-sectional view taken along the line III-III' of FIG. 3. For example, FIG. 3 may be an enlarged view of an area A of FIG. 2.

Referring to FIGS. 2, 3, and 4, the first pixel PXL1 may include first to third sub-pixels SPX1, SPX2, and SPX3. For example, the first sub-pixel SPX1 may emit red light, the second sub-pixel SPX2 may emit green light, and the third sub-pixel SPX3 may emit blue light. The second pixel PXL2 may have a substantially same structure as the first pixel SPX1 and may be driven in a substantially same driving method.

According to some example embodiments, the first pixel PXL1 may be electrically connected to the first gate line GL1. The first gate line GL1 may be electrically connected to the first connection line CL1 through a first contact hole CNT1. Accordingly, the first pixel PXL1 may receive the first gate signal GS1. In other words, the first pixel PXL1 may receive a first output gate signal from the first partial gate driver PGDV1. For example, the first to third sub-pixels SPX1, SPX2, and SPX3 included in the first pixel PXL1 may receive the first gate signal GS1.

According to some example embodiments, the second pixel PXL2 may be electrically connected to the second gate line GL2. The second gate line GL2 may be electrically connected to the second connection line CL2 through a second contact hole CNT2. Accordingly, the second pixel PXL2 may receive the second gate signal GS2. In other words, the second pixel PXL2 may receive a second output gate signal from the first partial gate driver PGDV1. For example, first to third sub-pixels included in the second pixel PXL2 may receive the second gate signal GS2.

According to some example embodiments, the second connection line CL2 and the first gate line GL1 may not be electrically connected to each other. For example, a contact hole may not be formed in a region where the second connection line CL2 and the first gate line GL1 overlap. In addition, the first connection line CL1 and the second gate line GL2 may not be electrically connected to each other. For example, a contact hole may not be formed in a region where the first connection line CL1 and the second gate line GL2 overlap.

According to some example embodiments, the first pixel PXL1 may be electrically connected to the first to third data lines DL1, DL2, and DL3. In detail, the first sub-pixel SPX1 included in the first pixel PXL1 may be electrically connected to the first data line DL1, the second sub-pixel SPX2 may be electrically connected to the second data line DL2, and the third sub-pixel SPX3 may be electrically connected to the third data line DL3. Accordingly, the first to third sub-pixels SPX1, SPX2, and SPX3 may receive different data voltages DATA.

According to some example embodiments, each of the first to third sub-pixels SPX1, SPX2, and SPX3 may receive a high power voltage ELVDD from the first high power voltage line ELVDDL1, may receive a low power voltage ELVSS from the first low power voltage line ELVSSL1, and may receive an initialization voltage VINT from the first sensing line SL1.

As shown in FIG. 4, the first sub-pixel SPX1 may include a first transistor T1, a second transistor T2, a third transistor T3, a storage capacitor CST, and a light emitting diode LED. For example, each of the first to third transistors T1, T2, and T3 may be implemented as an n-type transistor or a p-type transistor. In addition, each of the second and third sub-pixels SPX2 and SPX3 may include a first transistor T1, a second transistor T2, a third transistor T3, a storage capacitor CST, and a light emitting diode LED. The light emitting diode LED may include an organic light emitting diode ("OLED") or a nano light emitting diode ("nano-LED").

The first transistor T1 may include a control terminal connected to the second transistor T2, a first terminal connected to the first high power voltage line ELVDDL1, and a second terminal connected to the light emitting diode LED. For example, the first transistor T1 may be referred to as a driving transistor.

The second transistor T2 may include a control terminal connected to the first gate line GL1, a first terminal connected to the first data line DL1, and a second terminal connected to the first transistor T1. For example, the second transistor T2 may be referred to as a switching transistor.

The third transistor T3 may include a control terminal connected to the first gate line GL1, a first terminal connected to the light emitting diode LED, and a second terminal connected to the first sensing line SL1. For example, the third transistor T3 may be referred to as a sensing transistor.

The storage capacitor CST may include a first terminal connected to the control terminal of the first transistor T1 and a second terminal connected to the second terminal of the first transistor T1.

The OLED may include a first terminal connected to the first transistor T1 and a second terminal connected to the low power voltage ELVSS. For example, the first terminal may be an anode terminal, and the second terminal may be a cathode terminal. The OLED may include functional layers (e.g., electron/hole injection layers and electron/hole transport layers) and an organic material layer located between the functional layers, and may emit light in a certain wavelength range depending on a material constituting the organic material layer.

The nano-LED may include a first terminal connected to the first transistor T1 and a second terminal connected to the low power voltage ELVSS. For example, the first terminal may be an anode terminal, and the second terminal may be a cathode terminal. The nano-LED may include semiconductor layers (e.g., an n-type semiconductor layer and a p-type semiconductor layer) and an active material layer located between the semiconductor layers. Accordingly, light in a certain wavelength range can be emitted.

For example, the high power voltage ELVDD may be greater than the low power voltage ELVSS. The high power voltage ELVDD may be a high power voltage, and the low power voltage ELVSS may be a low power voltage.

Referring to FIGS. 2, 3, and 5, the first sub-pixel SPX1 may include a substrate 100, a first insulating layer ILD1, an active pattern 300, a second insulating layer ILD2, a gate electrode 400, a third insulating layer ILD3, a connection electrode 500, a via insulating layer VIA, a first electrode 610, an emission layer 620, and a second electrode 630.

The substrate 100 may include a glass substrate, a quartz substrate, a plastic substrate, or the like. According to some example embodiments, the substrate 100 may include the glass substrate. Accordingly, the display device 1000 may be a rigid display device. According to some example embodiments, the substrate 100 may include the plastic substrate. Accordingly, the display device 1000 may be a flexible display device. In this case, the substrate 100 may have a structure in which at least one organic film layer and at least one barrier layer are alternately stacked.

The first data line DL1 may be located on the substrate 100. According to some example embodiments, the first data line DL1 may provide the data voltage DATA to the first sub-pixel SPX1. For example, the first data line DL1 may include a metal, an alloy, a conductive metal oxide, a transparent conductive material, or the like. For example, the first data line DL1 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("T1"), tantalum ("Ta"), platinum ("Pt"), scandium ("Sc"), indium tin oxide ("ITO"), indium zinc oxide ("IZO"), and the like.

The first insulating layer ILD1 may cover the first data line DL1 and may be located on the substrate 100. The first insulating layer ILD1 may include an insulating material. For example, the first insulating layer ILD1 may include silicon oxide, silicon nitride, titanium oxide, tantalum oxide, or the like.

The active pattern 300 may be located on the first insulating layer ILD1. For example, the active pattern 300 may include amorphous silicon, polycrystalline silicon, or oxide semiconductor. According to some example embodiments, ions may be selectively implanted into the active pattern 300. For example, when the first, second, and third transistors T1, T2, and T3 are the n-type transistors, the active pattern 300 may include a source region and a drain region into which anions are injected, and a channel region into which the anions are not injected.

The second insulating layer ILD2 may cover the active pattern 300 and may be located on the first insulating layer ILD1. The second insulating layer ILD2 may include an insulating material.

The gate electrode 400 may be located on the second insulating layer ILD2. According to some example embodiments, the gate electrode 400 may receive the first gate signal GS1 through the first gate line GL1. For example, the gate electrode 400 may include a metal, an alloy, a conductive metal oxide, a transparent conductive material, or the like. For example, the gate electrode 400 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like. According to some example embodiments, the gate electrode 400 may include the molybdenum ("Mo"), an alloy containing the molybdenum, or the like.

The third insulating layer ILD3 may cover the gate electrode 400 and may be located on the second insulating layer ILD2. The third insulating layer ILD3 may include an insulating material.

The connection electrode 500 may be located on the third insulating layer ILD3. For example, the connection electrode may include a metal, an alloy, a conductive metal oxide, a transparent conductive material, and the like. For example, the connection electrode 500 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like. According to some example embodiments, in order to reduce an electrical resistance of the connection electrode 500, the connection electrode 500 may include the aluminum ("Al"). For example, the connection electrode 500 may have Ti/Al/Ti structure.

According to some example embodiments, the connection electrode 500 may include a source electrode 510 and a drain electrode 520. For example, the source electrode 510 may partially overlap the first data line DL1 and the active pattern 300. The drain electrode 520 may partially overlap the active pattern 300. For example, the source electrode 510 may contact the first data line DL1 through a contact hole formed in the first, second, and third insulating layers ILD1, ILD2, and ILD3. In addition, the source electrode 510 may contact the active pattern 300 through a contact hole formed in the second and third insulating layers ILD2 and ILD3. The drain electrode 520 may contact the active pattern 300 through a contact hole formed in the second and third insulating layers ILD2 and ILD3. In addition, the source and drain electrodes 510 and 520 may not overlap the gate electrode 400.

According to some example embodiments, the source electrode 510 may correspond to the first terminal of the second transistor T2, the drain electrode 520 may correspond to the second terminal of the second transistor T2, and the gate electrode 400 may correspond to the control terminal of the second transistor T2. Accordingly, the active pattern 300, the gate electrode 400, the source electrode 510, and the drain electrode 520 may constitute the second transistor T2. For example, the data voltage DATA may be applied to the first data line DL1, the source electrode 510, the active pattern 300, and the drain electrode 520 in response to the first gate signal GS1.

The via insulating layer VIA may cover the connection electrode 500 and may be located on the third insulating layer ILD3. For example, the via insulating layer VIA may have a substantially flat top surface. According to some example embodiments, the via insulating layer VIA may include an organic insulating material. For example, the via insulating layer VIA may include a photoresist, a polyacrylic resin, a polyimide resin, an acrylic resin, or the like.

The first electrode 610 may be located on the via insulating layer VIA. For example, the first electrode 610 may include a metal, an alloy, a conductive metal oxide, a transparent conductive material, or the like. The emission layer 620 may be located on the first electrode 610. According to some example embodiments, a pixel defining layer including an opening exposing an upper surface of the first electrode 610 may be located on the first electrode 610, and the emission layer 620 may be located in the opening. For example, the emission layer 620 may include an organic emission material. The organic light emitting material may emit light by receiving electric current. The second electrode 630 may be located on the emission layer 620. For example, the second electrode 630 may include a metal, an alloy, a conductive metal oxide, a transparent conductive material, or the like. According to some example embodiments, the first electrode 610, the emission layer 620, and the second electrode 630 may constitute the light emitting diode LED.

Referring to FIGS. 2, 3, 5, and 6, the first connection line CL1 may include a first metal pattern MP1, a second metal pattern MP2, and a third metal pattern MP3.

According to some example embodiments, the first metal pattern MP1 may be located between the substrate 100 and the active pattern 300. For example, the first metal pattern MP1 may extend in the first direction D1. The first metal pattern MP1 may include a same material as the first data line DL1. For example, the first metal pattern MP1 may include a metal, an alloy, a conductive metal oxide, a transparent conductive material, and the like. For example, the first metal pattern MP1 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like. For example, the first metal pattern MP1 may be formed together with the first data line DL1.

According to some example embodiments, the second metal pattern MP2 may be located on the second insulating layer ILD2, may overlap the first metal pattern MP1, and may be electrically connected to the first metal pattern MP1. For example, the second metal pattern MP2 may contact the first metal pattern MP1 through a contact hole formed in the first and second insulating layers ILD1 and ILD2. For example, the second metal pattern MP2 may extend in the first direction D1 and may be located along the first direction D1. For example, the second metal pattern MP2 may not be formed in a region where the first metal pattern MP1 and the first gate line GL1 contact each other. The second metal pattern MP2 may include a same material as the gate electrode 400. For example, the second metal pattern MP2 may include a metal, an alloy, a conductive metal oxide, a transparent conductive material, and the like. For example, the second metal pattern MP2 may be formed together with the gate electrode 400.

According to some example embodiments, the third metal pattern MP3 may be located on the third insulating layer ILD3, may overlap the first and second metal patterns MP1 and MP2, and may be electrically connected to the first metal pattern MP1. For example, the third metal pattern MP3 may contact the first metal pattern MP1 through a contact hole formed in the first to third insulating layers ILD1, ILD2, and ILD3. For example, the third metal pattern MP3 may extend in the first direction D1 and may be arranged along the first direction D1. For example, the third metal pattern MP3 may not be formed in the region where the first metal pattern MP1 and the first gate line GL1 contact each other. The third metal pattern MP3 may include a same material as the connection electrode 500. For example, the third metal pattern MP3 may include a metal, an alloy, a conductive metal oxide, a transparent conductive material, and the like. For example, the third metal pattern MP3 may be formed together with the connection electrode 500.

The first gate signal GS1 may be transmitted to the first gate line GL1 through the first to third metal patterns MP1, MP2, and MP3. When the first connection line CL1 includes the first to third metal patterns MP1, MP2, and MP3 vertically stacked, an electrical resistance of the first connection line CL1 may be reduced.

The first gate line GL1 may be located on the third insulating layer ILD3. For example, the first gate line GL1 may contact the first metal pattern MP1 through the first contact hole CNT1 exposing the first metal pattern MP1 overlapping the first gate line GL1. Accordingly, the first gate line GL1 may receive the first gate signal GS1 from the first metal pattern MP1.

The second gate line GL2 may be located on the third insulating layer ILD3. For example, the second gate line GL2 may contact the fourth metal pattern through the second contact hole CNT2 exposing the fourth metal pattern overlapping the second gate line GL2. Accordingly, the second gate line GL2 may receive the second gate signal from the fourth metal pattern. According to some example embodiments, the first contact hole CNT1 and the second contact hole CNT2 may be spaced apart from each other.

Referring to FIGS. 3 and 7, the second connection line CL2 may have a substantially same structure as the first connection line CL1. For example, the second connection line CL2 may include a fourth metal pattern MP4, a fifth metal pattern MP5 located on the fourth metal pattern MP4, and a sixth metal pattern MP6 located on the fifth metal pattern MP5.

The second connection line CL2 may not be electrically connected to the first gate line GL1. For example, a contact hole may not be formed in a region where the second connection line CL2 and the first gate line GL1 overlap. Accordingly, the second gate signal GS2 flowing through the second connection line CL2 may not be transmitted to the first gate line GL1.

Referring to FIGS. 2 and 3 again, the first and second connection lines CL1 and CL2 may be located between the first high power voltage line ELVDDL1 and the first low power voltage line ELVSSL1, on a plane (e.g., in a plan view or a view perpendicular or normal with respect to a plane of the display surface). The second connection line CL2 may be located between the first connection line CL1 and the first high power voltage line ELVDDL1, on a plane. The first high power voltage line ELVDDL1 may be located between the second connection line CL2 and the first pixel PXL1, on a plane. The first to third data lines DL1, DL2, and DL3 may be located between the first pixel PXL1 and the first sensing line SL1, on a plane.

Figure 8:
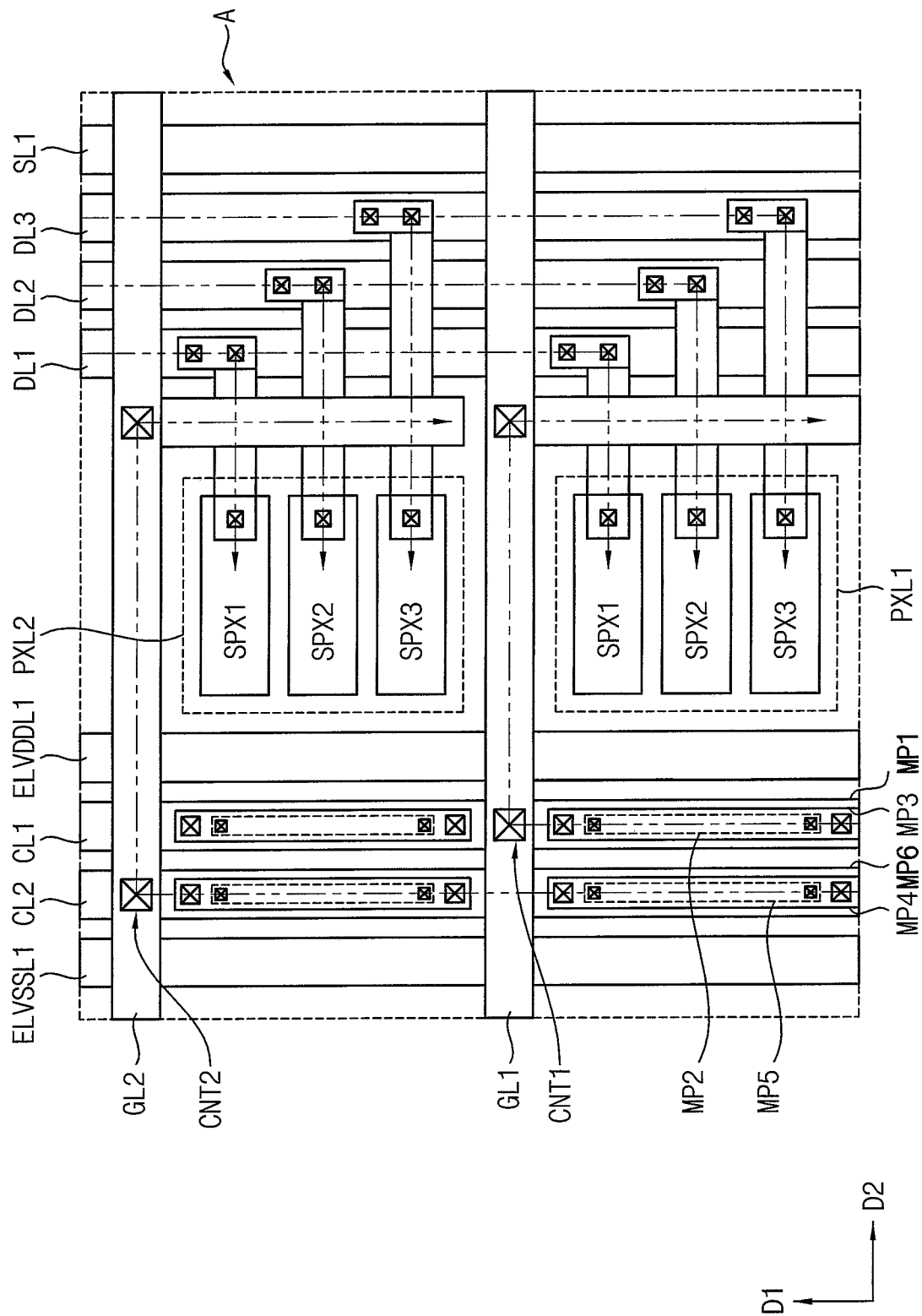
FIG. 8 is an enlarged view illustrating further details of the display device of FIG. 2.

FIG. 8 is an enlarged view illustrating further details of the display device of FIG. 2. For example, FIG. 8 may be an enlarged view of an area A of FIG. 2.

Referring to FIGS. 2 and 8, the first divided driving part SDP1 may include a first pixel PXL1, a second pixel PXL2, a first low power voltage line ELVSSL1, a second connection line CL2, a first connection line CL1, a high power voltage line ELVDDL1, a first data line DL1, a second data line DL2, a third data line DL3, a first sensing line SL1, a first gate line GL1, and a second gate line GL2. However, the first pixel PXL1, the second pixel PXL2, the first low power voltage line ELVSSL1, the second connection line CL2, the first connection line CL1, the high power voltage line ELVDDL1, the first data line DL1, the second data line DL2, the third data line DL3, the first sensing line SL1, the first gate line GL1, and the second gate line GL2 of FIG. 8 may be a substantially same as the first pixel PXL1, the second pixel PXL2, the first low power voltage line ELVSSL1, the second connection line CL2, the first connection line CL1, the high power voltage line ELVDDL1, the first data line DL1, the second data line DL2, the third data line DL3, the first sensing line SL1, the first gate line GL1, and the second gate line GL2 of FIG. 3, except for a plane structure in which the above components are located. Hereinafter, the plane structure in which the above components are located will be described in more detail below.

The first and second connection lines CL1 and CL2 may be located between the first high power voltage line ELVDDL1 and the first low power voltage line ELVSSL1, on a plane. The first connection line CL1 may be located between the second connection line CL2 and the first high power voltage line ELVDDL1, on a plane. The first high power voltage line ELVDDL1 may be located between the first connection line CL1 and the first pixel PXL1, on a plane. The first pixel PXL1 may be located between the first high power voltage line ELVDDL1 and the first data line DL1, on a plane. The first to third data lines DL1, DL2, and DL3 may be located between the first pixel PXL1 and the first sensing line SL1, on a plane.

Figure 9:
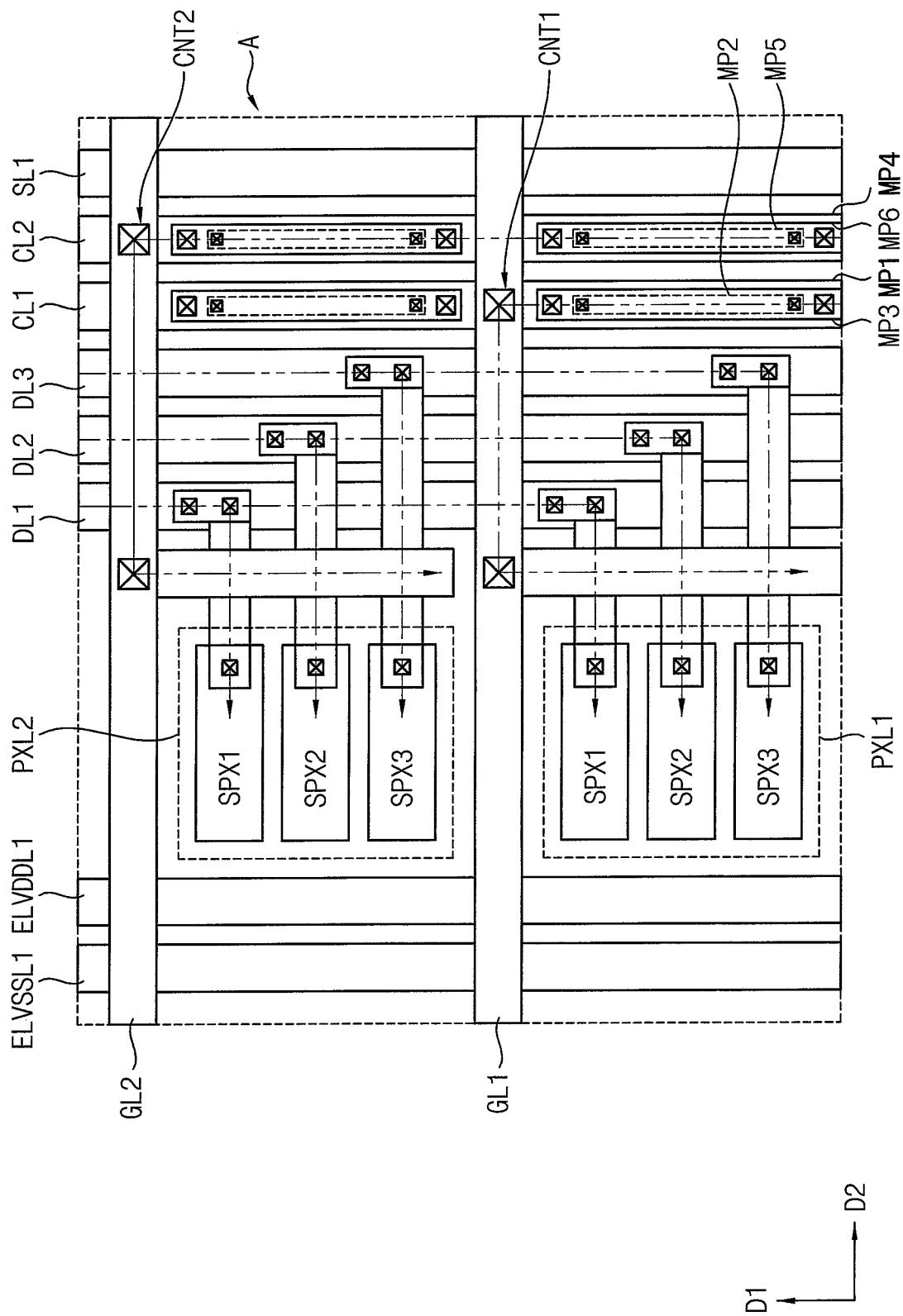
FIG. 9 is an enlarged view illustrating further details of the display device of FIG. 2.

FIG. 9 is an enlarged view illustrating further details of the display device of FIG. 2.

Referring to FIGS. 2 and 9, the first divided driving part SDP1 may include a first pixel PXL1, a second pixel PXL2, a first low power voltage line ELVSSL1, a second connection line CL2, a first connection line CL1, a high power voltage line ELVDDL1, a first data line DL1, a second data line DL2, a third data line DL3, a first sensing line SL1, a first gate line GL1, and a second gate line GL2. However, the first pixel PXL1, the second pixel PXL2, the first low power voltage line ELVSSL1, the second connection line CL2, the first connection line CL1, the high power voltage line ELVDDL1, the first data line DL1, the second data line DL2, the third data line DL3, the first sensing line SL1, the first gate line GL1, and the second gate line GL2 of FIG. 9 may be a substantially same as the first pixel PXL1, the second pixel PXL2, the first low power voltage line ELVSSL1, the second connection line CL2, the first connection line CL1, the high power voltage line ELVDDL1, the first data line DL1, the second data line DL2, the third data line DL3, the first sensing line SL1, the first gate line GL1, and the second gate line GL2 of FIG. 3, except for a plane structure in which the above components are located. Hereinafter, the plane structure in which the above components are located will be described in more detail.

The first and second connection lines CL1 and CL2 may be located between the third data line DL3 and the first sensing line SL1, on a plane. The first connection line CL1 may be located between the third data line DL3 and the second connection line CL2. The first pixel PXL1 may be located between the first data line DL1 and the first high power voltage line ELVDDL1. The first high power voltage line ELVDDL1 may be located between the first pixel PXL1 and the first low power voltage line ELVSS1.

Figure 10:
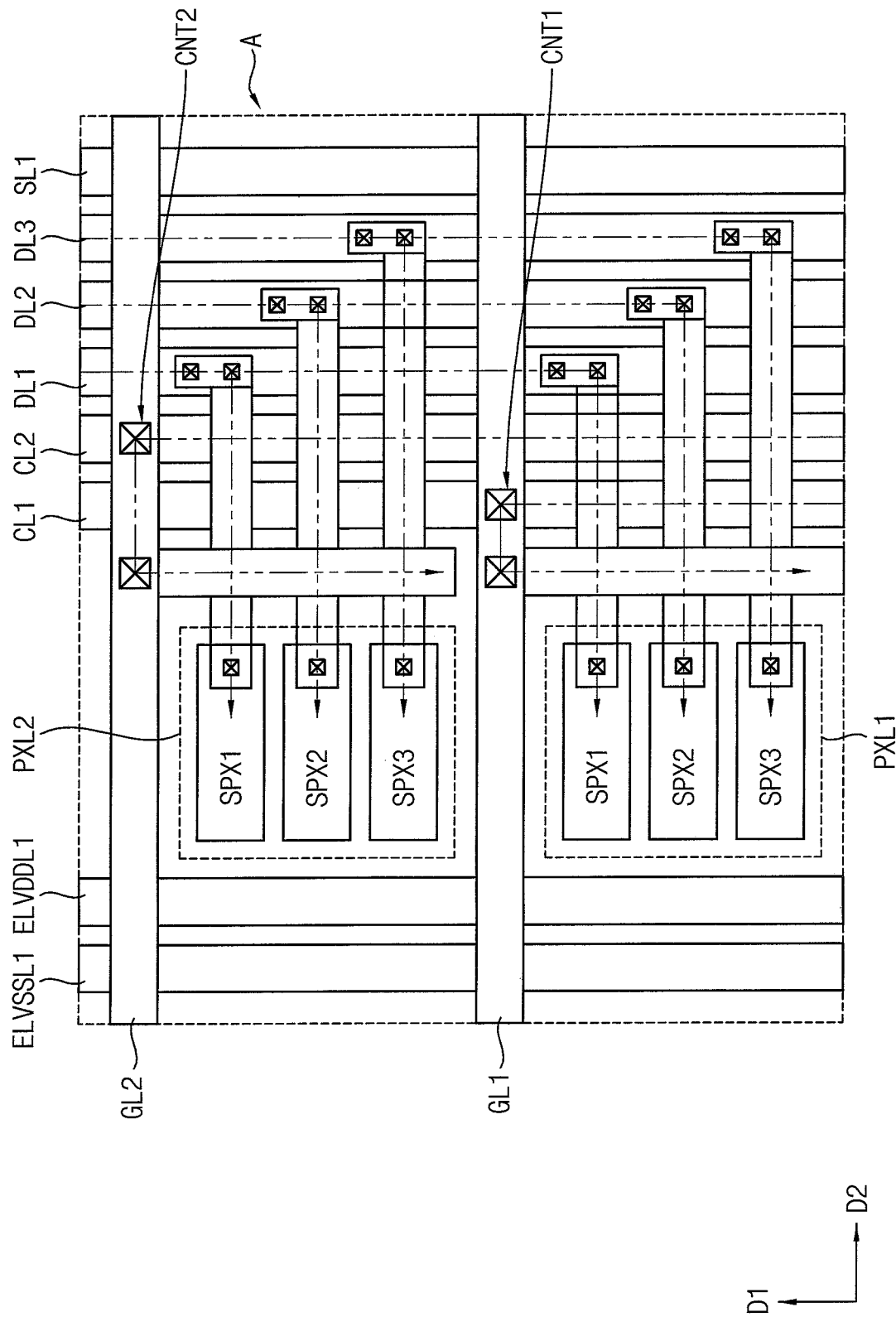
FIG. 10 is an enlarged view illustrating further details of the display device of FIG. 2.

FIG. 10 is an enlarged view illustrating further details of the display device of FIG. 2.

Referring to FIGS. 2 and 10, the first divided driving part SDP1 may include a first pixel PXL1, a second pixel PXL2, a first low power voltage line ELVSSL1, a second connection line CL2, a first connection line CL1, a high power voltage line ELVDDL1, a first data line DL1, a second data line DL2, a third data line DL3, a first sensing line SL1, a first gate line GL1, and a second gate line GL2. However, the first pixel PXL1, the second pixel PXL2, the first low power voltage line ELVSSL1, the second connection line CL2, the first connection line CL1, the high power voltage line ELVDDL1, the first data line DL1, the second data line DL2, the third data line DL3, the first sensing line SL1, the first gate line GL1, and the second gate line GL2 of FIG. 10 may be a substantially same as the first pixel PXL1, the second pixel PXL2, the first low power voltage line ELVSSL1, the second connection line CL2, the first connection line CL1, the high power voltage line ELVDDL1, the first data line DL1, the second data line DL2, the third data line DL3, the first sensing line SL1, the first gate line GL1, and the second gate line GL2 of FIG. 3, except for a plane structure in which the above components are located. Hereinafter, the plane structure in which the above components are located will be described.

The first and second connection lines CL1 and CL2 may be located between the first pixel PXL1 and the first data line DL1, on a plane. The first connection line CL1 may be located between the first pixel PXL1 and the second connection line CL2, on a plane.

The display panel according to some example embodiments may include the plurality of divided driving parts, and each of the gate signals may be provided to the divided driving parts. Accordingly, a transmission time of the gate signal transmitted to a pixel far from the gate driver can be relatively shortened. In this case, in order to provide each of the gate signals to the divided driving parts, the display panel may include a plurality of connection lines arranged to correspond to a pixel column.

In addition, the display device including the display panel may include a data driver located in the non-display area adjacent to one side (e.g., the lower side) of the display panel, and the gate driver may be located in the non-display area. Because the gate driver and the data driver are located on one side of the display device, a bezel of the display device may be reduced.

Although aspects of some example embodiments and implementations have been described herein, other embodiments and modifications will be apparent from this description. Accordingly, the inventive concepts are not limited to such embodiments, but rather to the broader scope of the appended claims and their equivalents and various modifications and equivalent arrangements as would be apparent to a person of ordinary skill in the art.

What is claimed is:

1. A display panel comprising:
   a plurality of divided driving parts, wherein at least a divided driving part of the divided driving parts comprises:
   a first connection line extending in a first direction;
   a second connecting line extending in the first direction and spaced apart from the first connection line in a second direction crossing the first direction;
   a first gate line extending in the second direction and electrically connected to the first connection line;
   a second gate line extending in the second direction, being spaced apart from the first gate line, and being electrically connected to the second connection line;
   a first pixel in a first pixel column and a first pixel row and electrically connected to the first gate line; and
   a second pixel in the first pixel column and a second pixel row and electrically connected to the second gate line, wherein the second pixel row is spaced apart from the first pixel row in the first direction, and
   wherein the first connection line and the second connection line correspond to the first pixel column.

2. The display panel of claim 1, wherein the divided driving part further comprises a high power voltage line extending in the first direction, and
   the high power voltage line corresponds to the first pixel column.

3. The display panel of claim 2, wherein the divided driving part further comprises at least one data line extending in the first direction, and
   wherein the data line corresponds to the first pixel column and is electrically connected to the first pixel and the second pixel.

4. The display panel of claim 3, wherein the second connection line is between the first connection line and the first pixel in a plan view.

5. The display panel of claim 4, wherein the first pixel is between the second connection line and the data line in a plan view.

6. The display panel of claim 4, wherein the divided driving part further comprises a low power voltage line extending in the first direction and spaced apart from the high power voltage line in the second direction, and
wherein the first connection line and the second connection line are between the high power voltage line and the low power voltage line in a plan view.

7. The display panel of claim 6, wherein the high power voltage line is between the second connection line and the first pixel in a plan view.

8. The display panel of claim 3, wherein the first pixel comprises a first sub-pixel, a second sub-pixel, and a third sub-pixel, and
wherein the data line comprises first to third data lines spaced apart from each other in the second direction and electrically connected to the first to third sub-pixels, respectively.

9. The display panel of claim 8, wherein the first sub-pixel comprises:
a substrate;
an active pattern on the substrate;
a gate electrode on the active pattern; and
a connection electrode on the gate electrode,
wherein the first gate line is in a same layer as the connection electrode, and
wherein the first gate line contacts the first connection line through a first contact hole exposing the first connection line overlapping the first gate line.

10. The display panel of claim 9, wherein the first connection line comprises a first metal pattern, and
wherein the first metal pattern is between the substrate and the active pattern and extending in the first direction.

11. The display panel of claim 10, wherein the first connection line further comprises a second metal pattern, and
wherein the second metal pattern is on the first metal pattern, overlaps the first metal pattern, and is electrically connected to the first metal pattern.

12. The display panel of claim 11, wherein the first connection line further comprises a third metal pattern, and
wherein the third metal pattern is on the second metal pattern, overlaps the second metal pattern, and is electrically connected to the second metal pattern.

13. The display panel of claim 12, wherein the second metal pattern is in a same layer as the gate electrode, and
wherein the third metal pattern is in a same layer as the connection electrode.

14. The display panel of claim 9, wherein the first sub-pixel further comprises:
a first electrode on the connection electrode;
an emission layer on the first electrode; and
a second electrode on the emission layer.

15. The display panel of claim 9, wherein the second gate line is in a same layer as the connection electrode, and
wherein the second gate line contacts the second connection line through a second contact hole exposing the second connection line overlapping the second gate line.

16. The display panel of claim 15, wherein the first contact hole and the second contact hole are spaced apart from each other.

17. The display panel of claim 3, wherein the first connection line is between the second connection line and the first pixel in a plan view.

18. The display panel of claim 17, wherein the first pixel is between the first connection line and the data line in a plan view.

19. The display panel of claim 17, wherein the divided driving part further comprises a low power voltage line spaced apart from the high power voltage line in the second direction, and
wherein the first connection line and the second connection line are between the high power voltage line and the low power voltage line in a plan view.

20. The display panel of claim 19, wherein the high power voltage line is between the first connection line and the first pixel in a plan view.

21. The display panel of claim 3, wherein the data line is between the first pixel and the first connection line in a plan view.

22. The display panel of claim 21, wherein the first connection line is between the data line and the second connection line in a plan view.

23. The display panel of claim 3, wherein the first connection line and the second connection line are between the first pixel and the data line in a plan view.

24. The display panel of claim 1, wherein the divided driving part further comprises a dummy line extending in the first direction and being in a same layer as the first and second connection lines,
wherein a gate signal is provided to each of the first and second connection lines, and
wherein a constant voltage is provided to the dummy line.

25. The display panel of claim 1, wherein the divided driving parts are arranged along the second direction.

26. The display panel of claim 1, wherein the first connection line is not electrically connected to the second gate line.

27. The display panel of claim 26, wherein a contact hole is not formed in a region where the first connection line and the second gate line overlap.

28. The display panel of claim 26, wherein the second connection line is not electrically connected to the first gate line.

29. The display panel of claim 28, wherein a contact hole is not formed in a region where the second connection line and the first gate line overlap.

30. A display device comprising:
a display panel comprising a plurality of divided driving parts and being in a display area;
a gate driver in a non-display area adjacent to the display area;
a data driver in the non-display area; and
a timing controller in the non-display area and configured to control the gate driver and the data driver,
wherein at least a divided driving part of the divided driving parts comprises:
a first connection line extending in a first direction;
a second connecting line extending in the first direction and spaced apart from the first connection line in a second direction crossing the first direction;
a first gate line extending in the second direction and electrically connected to the first connection line;

a second gate line extending in the second direction, being spaced apart from the first gate line, and being electrically connected to the second connection line;

a first pixel in a first pixel column and a first pixel row and electrically connected to the first gate line; and a second pixel in the first pixel column and a second pixel row and electrically connected to the second gate line, wherein the second pixel row is spaced apart from the first pixel row in the first direction, and wherein the first connection line and the second connection line correspond to the first pixel column.

31. The display device of claim 30, wherein the gate driver and the data driver are in the non-display area adjacent to one side of the display panel.

\* \* \* \* \*